(12) United States Patent
Kim (10) Patent No.: US 8,456,384 B2
(45) Date of Patent: Jun. 4, 2013

(54) PLASMA DISPLAY DEVICE

(75) Inventor: Yong-Jin Kim, Suwon-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 552 days.

(21) Appl. No.: 12/707,556

(22) Filed: Feb. 17, 2010

(65) Prior Publication Data

US 2010/0207847 A1  Aug. 19, 2010

(30) Foreign Application Priority Data

Feb. 17, 2009  (KR) .................. 10-2009-0013103

(51) Int. Cl.
  *G09G 3/28*  (2006.01)
(52) U.S. Cl.
  USPC ............... 345/60; 345/37; 345/41; 345/55; 345/204; 315/169.4
(58) Field of Classification Search
  USPC ....... 345/37, 41, 60–73, 204.3, 55; 315/169.4
  See application file for complete search history.

(56) References Cited

U.S. PATENT DOCUMENTS

2006/0244741 A1* 11/2006 Kimura et al. ............. 345/204
2008/0143615 A1*  6/2008 Park et al. ................. 343/702

FOREIGN PATENT DOCUMENTS

| JP | 2008-203484 A | 9/2008 |
| KR | 1020050036637 | 4/2005 |
| KR | 1020070013941 | 1/2007 |

OTHER PUBLICATIONS

Korean Office Action for Korean Patent Application No. 10-2009-0013103—3 pages, dated Sep. 17, 2010.
Chinese Office Action dated Sep. 26, 2011 for Chinese Patent Application No. CN 201010114313.1 which shares priority of Korean Patent Application No. KR 10-2009-0013103 with captioned U.S. Appl. No. 12/707,556.

* cited by examiner

*Primary Examiner* — Lun-Yi Lao
*Assistant Examiner* — Insa Sadio
(74) *Attorney, Agent, or Firm* — Knobbe, Martens, Olson & Bear LLP (57) ABSTRACT

A plasma display device is disclosed. The plasma display device includes a plasma display panel (PDP), a printed circuit board assembly (PBA), and a flexible printed circuit (FPC) electrically connecting electrodes of the PBA and the PDP. In some embodiments, the FPC is formed of two films with signal lines therebetween and electrodes on opposite sides.

16 Claims, 7 Drawing Sheets

PLASMA DISPLAY DEVICE

CROSS-REFERENCE TO RELATED APPLICATION

This application claims priority to and the benefit of Korean Patent Application No. 10-2009-0013103 filed in the Korean Intellectual Property Office on Feb. 17, 2009, the entire contents of which are incorporated herein by reference.

BACKGROUND

1. Field

The field relates to a plasma display device. More particularly, the field relates to a plasma display device including electrode pads of a printed circuit board assembly (PBA).

2. Description of the Related Technology

A plasma display device includes a plasma display panel (PDP), a chassis base for supporting the PDP, and a plurality of printed circuit board assemblies (PBAs) mounted on the chassis base.

As is known in the art, the PDP displays an image using red (R), green (G), and blue (B) visible light created by exciting phosphors using vacuum ultraviolet (VUV) rays emitted from plasma generated by a gas discharge.

In PBAs, a scan buffer board assembly connected to a scan board assembly is mounted on the chassis base on the opposite side of the PDP to control scan electrodes in the PDP, and is connected to the scan electrodes through a flexible printed circuit (FPC).

One end of the FPC is connected to the scan electrodes of the PDP and the other end thereof is connected to the scan buffer board assembly in order to apply a signal of a scan IC mounted in the scan buffer board assembly to the scan electrodes.

SUMMARY OF CERTAIN INVENTIVE ASPECTS

One aspect is a plasma display device including a plasma display panel (PDP), a chassis base including a first surface and a second surface. The chassis base supports the PDP on the first surface. The device also includes a printed circuit board assembly (PBA) mounted on the second surface, and a flexible printed circuit (FPC) electrically connecting electrodes of the PBA and the PDP, where the FPC includes a first film, a second film, a plurality of signal lines formed between the first and second films, first electrode pads formed on the first film and bonded to the PBA, and second electrode pads formed on the second film and electrically connected to the first electrode pads by the signal lines and bonded to the electrodes of the PDP.

Another aspect is a plasma display device including a plasma display panel (PDP), a chassis base including a first surface and a second surface and supporting the PDP on the first surface, a printed circuit board assembly (PBA) mounted on the second surface, and a flexible printed circuit (FPC) electrically connecting electrodes of the PBA and the PDP, where the FPC includes a plurality of signal lines, a plurality of first electrode pads on a first side of the FPC, and a plurality of second electrode pads electrically connected to the first electrode pads by the signal lines, where the second electrode pads are on a second side of the FPC, where the second side is opposite the first side.

DETAILED DESCRIPTION OF CERTAIN INVENTIVE EMBODIMENTS

Certain inventive embodiments will be described more fully hereinafter with reference to the accompanying drawings, in which exemplary embodiments of the invention are shown. As those skilled in the art would realize, the described embodiments may be modified in various ways, without departing from the spirit or scope of the present invention. The drawings and description are to be regarded as illustrative in nature and not restrictive. Like reference numerals generally designate like elements throughout the specification.

Figure 1:
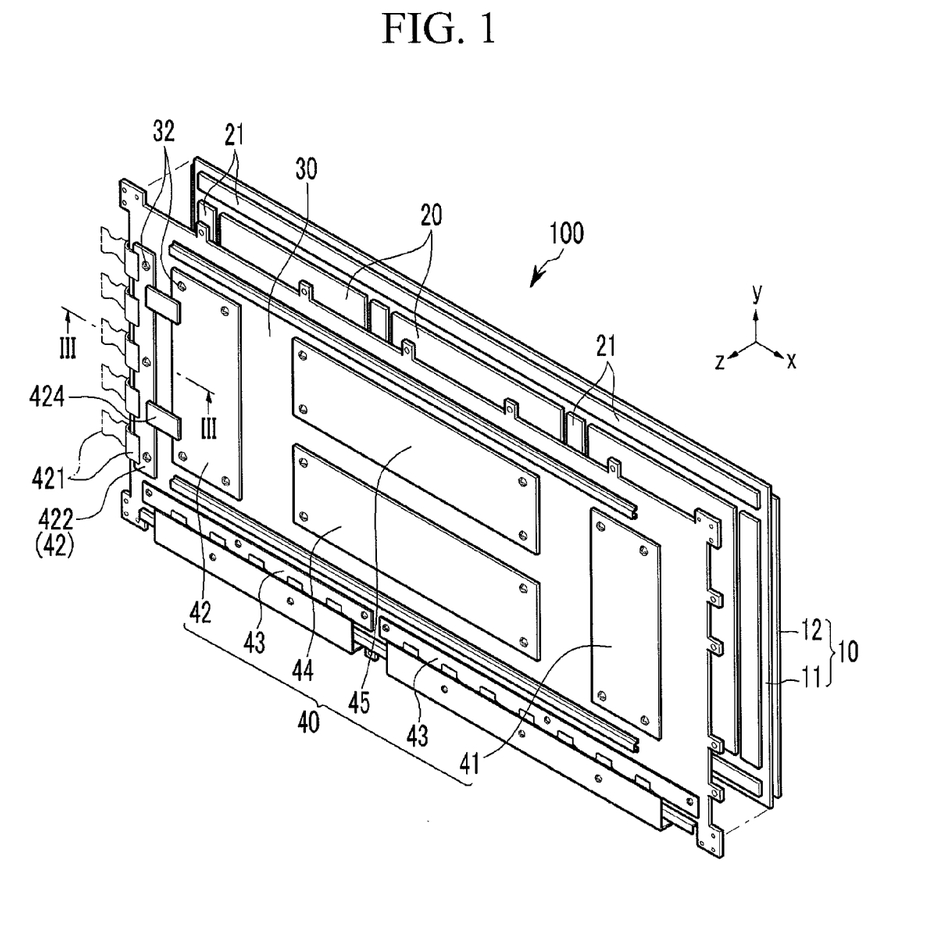
FIG. 1 is an exploded perspective view showing a plasma display device in accordance with an exemplary embodiment.

FIG. 1 is an exploded perspective view showing a plasma display device in accordance with an exemplary embodiment. Referring to FIG. 1, the plasma display device 100 includes a plasma display panel (PDP) 10 for displaying an image using gas discharge, a heat dissipation sheet 20, a chassis base 30, and a plurality of printed circuit board assemblies (PBAs) 40.

The PDP 10 includes a rear substrate 11 and a front substrate 12, which are formed of glass, and a plurality of electrodes disposed between the substrates 11 and 12 for generating gas discharge, such as a plurality of sustain electrodes (not shown), a plurality of scan electrodes 13 (see FIG. 3), and a plurality of address electrodes (not shown).

The heat dissipation sheet 20 is provided between the PDP 10 and the chassis base 30, which face each other, to dissipate heat generated in the PDP 10 by the gas discharge. The chassis base 30 is attached to the rear substrate 11 using a double-sided adhesive tape 21 with the heat dissipation sheet 20 interposed therebetween to support the PDP 10.

The PBAs 40 are electrically connected to the PDP 10 so as to drive the PDP 10. Each of the PBAs 40 performs its function of driving the PDP 10 and, for this purpose, the plurality of PBAs 40 are provided. For example, the PBAs 40 may include a sustain board assembly 41, a scan board assembly 42, an address buffer board assembly 43, a logic board assembly 44, and a power board assembly 45.

The sustain board assembly 41 is connected to the sustain electrodes through an FPC (not shown) to control the sustain electrodes. The scan board assembly 42 is connected to the scan electrodes 13 through an FPC 421 to control the scan electrodes 13 (see FIG. 3). The address buffer board assembly 43 is connected to the address electrodes through a tape carrier package TCP (not shown) equipped with a driver IC (not shown) to control the address electrodes. The logic board assembly 44 receives a video signal from the outside, generates control signals required to drive the address electrodes, the sustain electrodes, and the scan electrodes 13, and selectively applies the control signals to the corresponding board assemblies. The power board assembly 45 supplies electric power required to drive each board assembly.

The scan board assembly 42 may further include a scan buffer board assembly 422. In this case, the scan board assembly 42 controls the scan electrodes 13 through a scan IC 423 mounted in the scan buffer board assembly 422 based on the control signal of the logic board assembly 44. For this purpose, the scan board assembly 42 and the scan buffer board assembly 422 are electrically connected to each other through a connecting member 424. Accordingly, the scan board assembly 42 may directly control the scan electrodes 13 based on the control signal of the logic board assembly 44.

Figure 2:
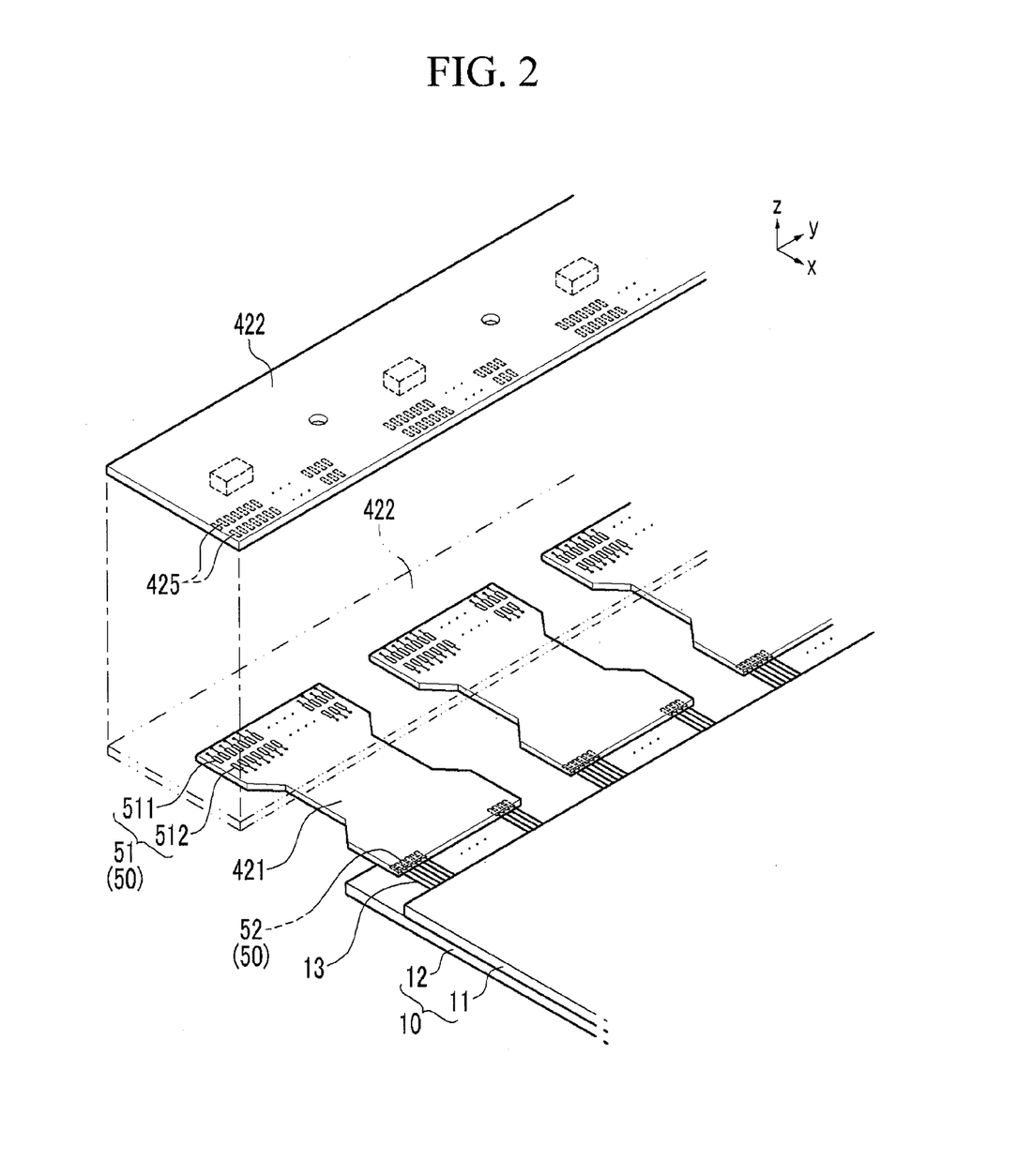
FIG. 2 is a perspective view showing connected and disconnected states of a scan buffer board assembly, a plasma display panel (PDP), and a flexible printed circuit (FPC) of FIG. 1.
Figure 3:
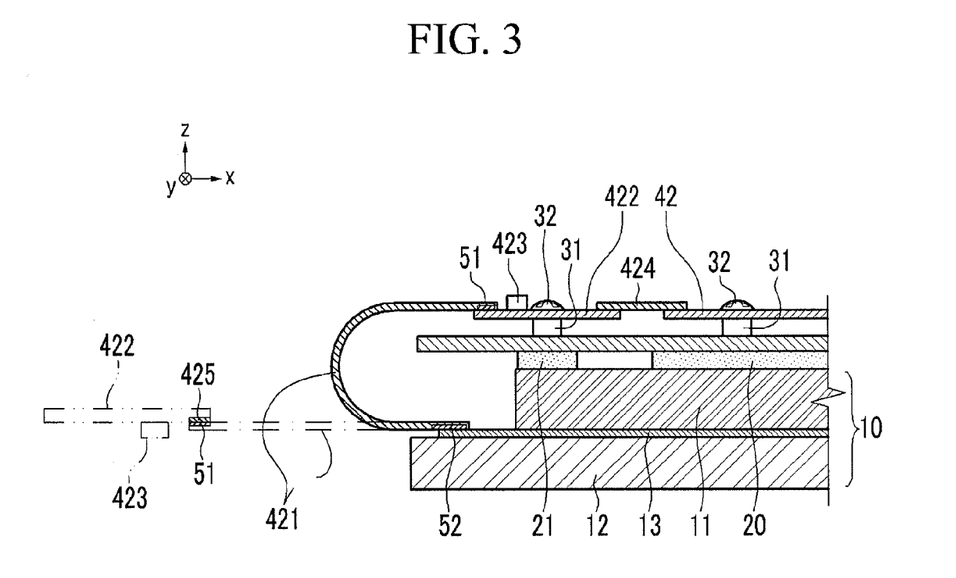
FIG. 3 is a cross-sectional view taken along line III-III of FIG. 1.

FIG. 2 is a perspective view showing connected and disconnected states of the scan buffer board assembly, the PDP, and the FPC of FIG. 1, and FIG. 3 is a cross-sectional view taken along line III-III of FIG. 1.

Referring to FIGS. 2 and 3, the PDP 10 is attached to a first surface (e.g., a front surface) of the chassis base 30, and the PBAs 40 are mounted on a second surface (e.g., a rear surface) of the chassis base 30. The plurality of PBAs 40, the scan board assembly 42 and the scan buffer board assembly 422 are placed on a plurality of bosses 31 provided on the chassis base 30 and mounted on the chassis base 30 by fastening set screws 32.

The scan buffer board assembly 422 is connected to the scan electrodes 13 of the PDP 10 through the FPC 421. That is, the FPC 421 extends around one side of the chassis base 30 and is bonded to the scan electrodes 13 of the PDP 10 and to terminal pads 425 of the scan buffer board assembly 422, by thermocompression. The FPC 421 may be efficiently applied to the PDP 10 having a large number of scan electrodes 13 such as a number sufficient to accommodate full high definition (FHD) by ensuring the pitch of electrode pads 50 within a limited area of the scan buffer board assembly 422. The terminal pads 425 are formed to correspond to the electrode pads 50 so as to be bonded to the electrode pads 50 by thermocompression.

Figure 4:
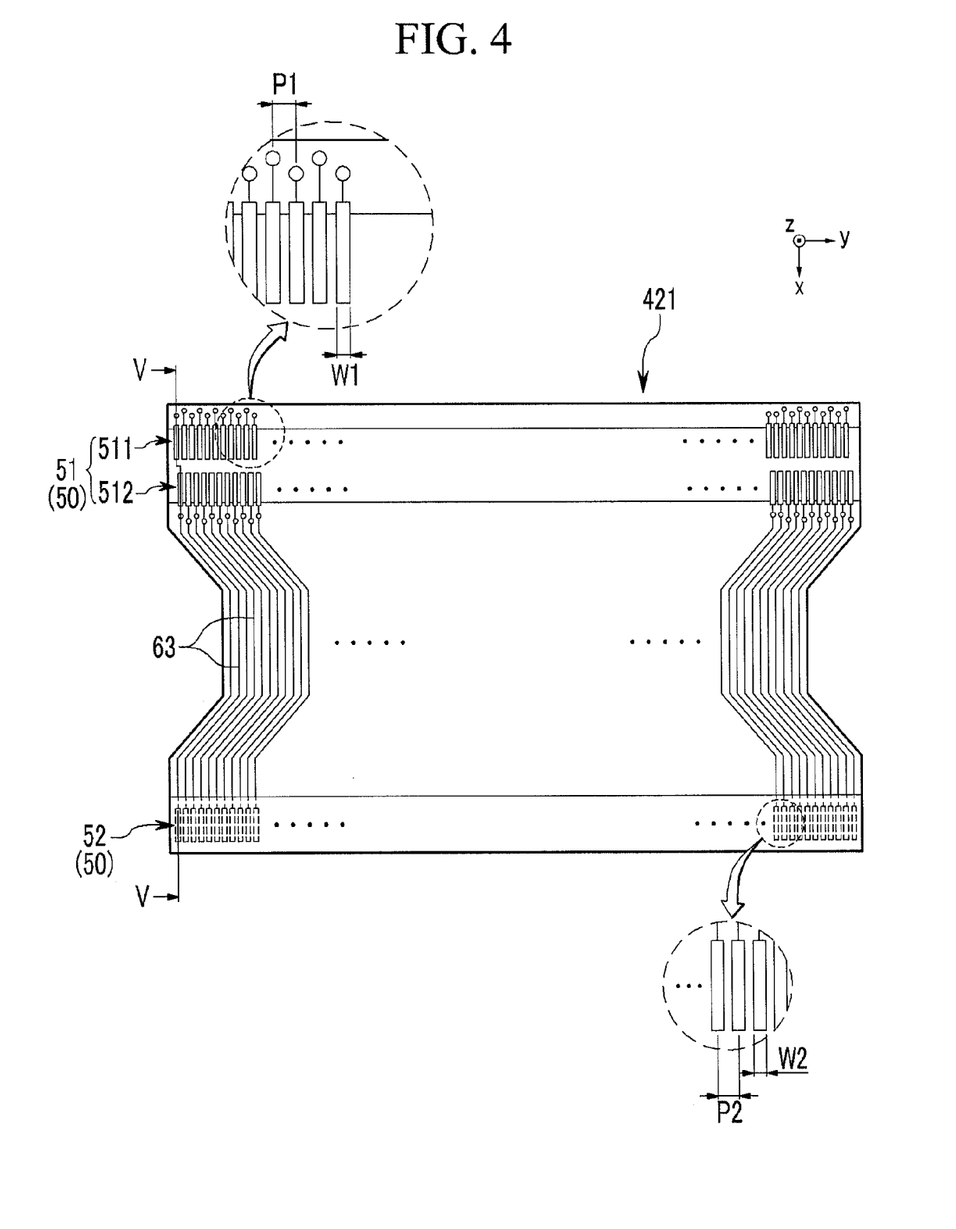
FIG. 4 is a top plan view showing a first electrode pad of the FPC connected to the scan buffer board assembly.
Figure 5:
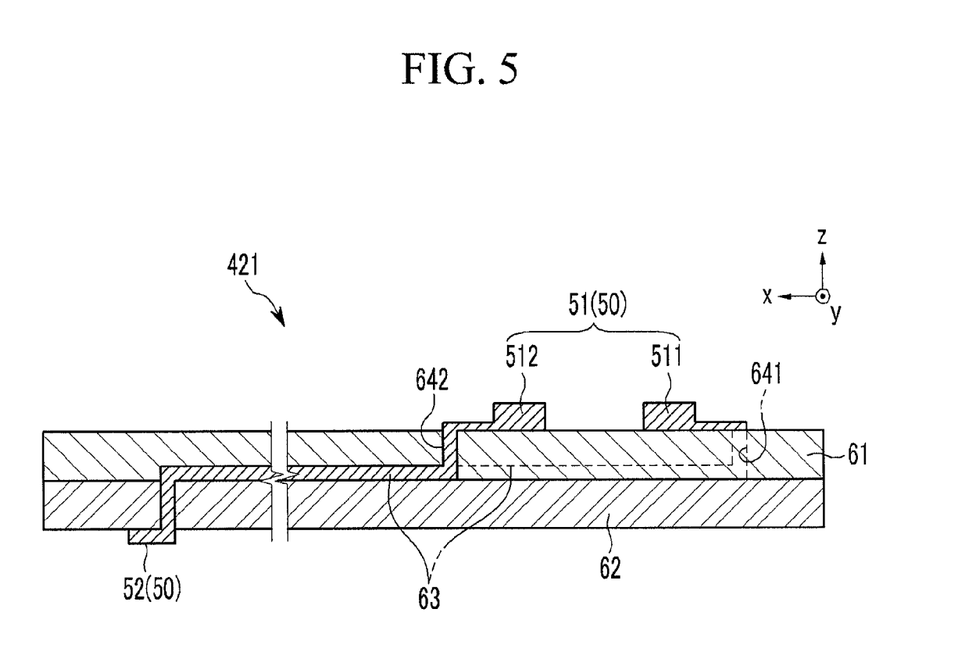
FIG. 5 is a cross-sectional view taken along line V-V of FIG. 4, showing the first electrode pad of the FPC connected to the scan buffer board assembly and a second electrode pad of the FPC connected to the PDP.

FIG. 4 is a top plan view showing a first electrode pad of the FPC connected to the scan buffer board assembly, and FIG. 5 is a cross-sectional view, taken along line V-V of FIG. 4, showing the first electrode pad of the FPC connected to the scan buffer board assembly and a second electrode pad of the FPC connected to the PDP.

Referring to FIGS. 4 and 5, the FPC 421 includes a first film 61 and a second film 62, a plurality of signal lines 63 formed between the first and second films 61 and 62, and electrode pads 50 connected to both ends of the signal lines 63.

The electrode pads 50 include a first electrode pad 51 connected to the signal lines 63 and exposed to the outside of the first film 61 and a second electrode pad 52 connected to the signal lines 63 on the opposite side of the first electrode pad 51 and exposed to the outside of the second film 62.

That is, as shown in FIG. 5, the first electrode pad 51 and the second electrode pad 52 are on opposite sides in the z direction of the FPC 421 and are generally on opposite ends in the x direction of the FPC 421.

Accordingly, as shown in FIG. 3, the FPC 421 is bonded to the first electrode pad 51 on the top surface in the z-axis direction of the scan buffer board assembly 422 and bonded to the second electrode pad 52 on the top surface in the z-axis direction of the PDP 10.

As shown in FIG. 5, the first electrode pads 51 protrude from the first film 61 and are disposed in two rows along the width direction (y-axis direction) of the FPC 421, and the second electrode pads 52 protrude from the second film 62 and are disposed in a row along the width direction (y-axis direction) of the FPC 421.

Although the widths in the y-axis direction of the FPC 421 are the same and the signal lines 63 are also the same, a first pitch P1 of the first electrode pads 51 is greater than a second pitch P2 of the second electrode pads 52 in some embodiments. Moreover, a first width W1 of the first electrode pad 51 may be greater than a second width W2 of the second electrode pad 52. That is, the first electrode pads 51 may be larger than the second electrode pads 52 in view of the pitch and width.

The first electrode pads 51 include two rows such as an eleventh electrode pad row 511 and a twelfth electrode pad row 512. The eleventh electrode pad row 511 is disposed at an end of the first film 61 with respect to the length direction (x-axis direction) of the signal lines 63, and the twelfth electrode pad row 512 is disposed on the first film 61 inside the eleventh electrode pad row 511.

The first electrode pads 51 of each of the eleventh electrode pad row 511 and the twelfth electrode pad row 512 are disposed such that axial centers of the electrodes of the eleventh and twelfth rows 511 and 512 alternate in a y-axis direction (y-axis direction).

Each of the first electrode pads 51 of the eleventh electrode pad row 511 is connected to a corresponding signal line 63 through a first via hole 641 formed in the first film 61, and each of the first electrode pads 51 of the twelfth electrode pad row 512 is connected to a corresponding signal line 63 through a second via hole 642 formed in the first film 61.

Figure 6:
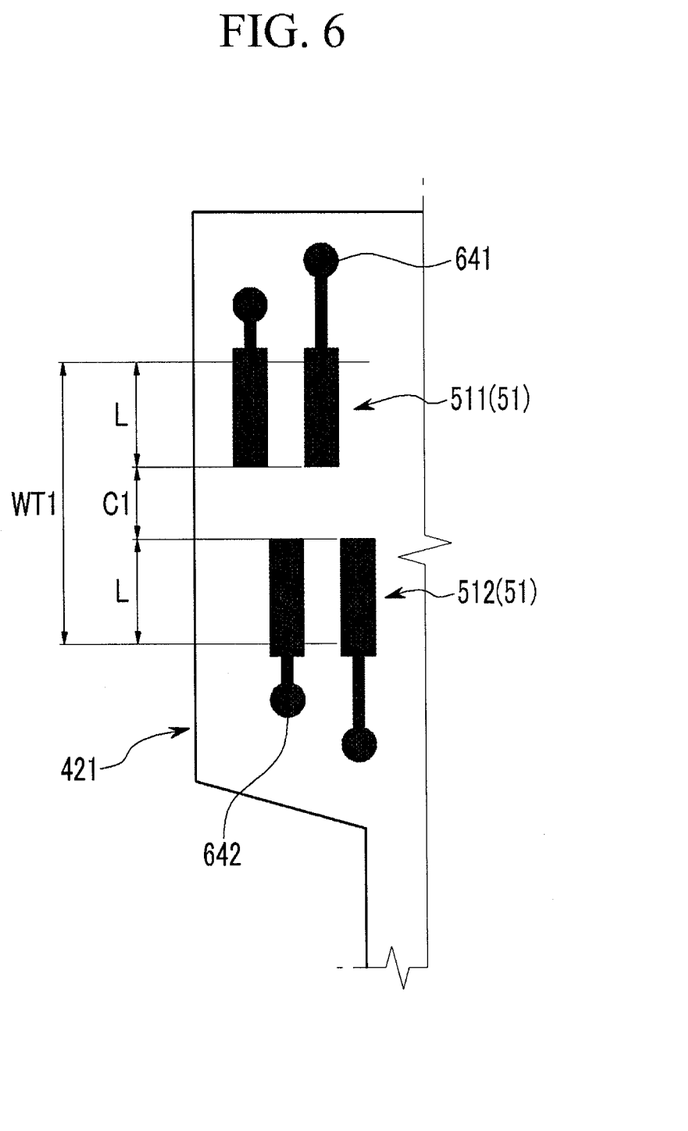
FIG. 6 is a detailed view of the first electrode pads of the FPC in the case where the FPC is connected to the scan buffer board assembly using a dual tool.
Figure 7:
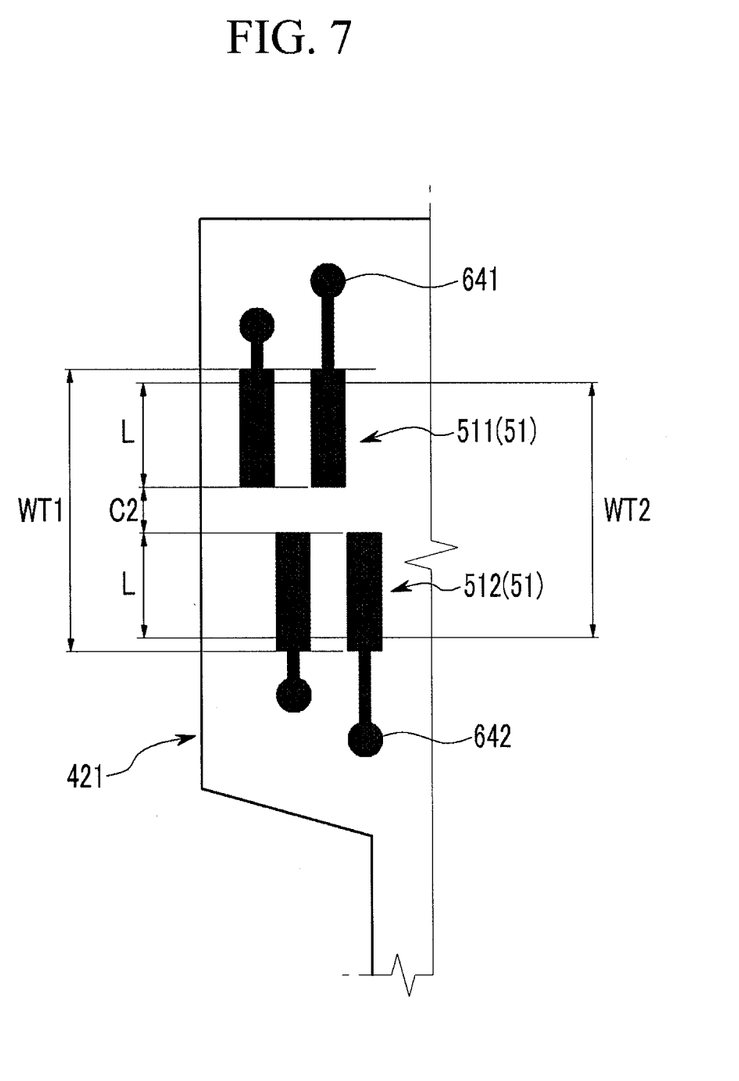
FIG. 7 is a detailed view of the first electrode pads of the FPC in the case where the FPC is connected to the scan buffer board assembly using a single tool.

FIG. 6 is a detailed view of the first electrode pads of the FPC in the case where the FPC is connected to the scan buffer board assembly using a dual tool, and FIG. 7 is a detailed view of the first electrode pads of the FPC in the case where the FPC is connected to the scan buffer board assembly using a single tool.

Referring to FIGS. 6 and 7, each of the first electrode pads 51 of the eleventh and twelfth electrode pad rows 511 and 512 formed on the FPC 421 is exposed with a length L to be bonded to the terminal pads 425 of the scan buffer board assembly 422 by thermocompression, and they have an interval C1 therebetween.

When bonding the FPC 421 to the scan buffer board assembly 422 by thermocompression, a tool (not shown) may be formed in a dual structure or in a single structure.

The dual tool bonds the eleventh electrode pad row 511 and the twelfth electrode pad row 512 by thermocompression with independent tools. For this purpose, a maximum width WT1 of compression tools used during the dual tool bonding may be equal to the sum (L+L+C1) of the lengths (L and L) of the first electrode pads 51 of the eleventh and twelfth electrode pad rows 511 and 512 and the interval C1 between the first electrode pads 51. See FIG. 6.

The single tool bonds the eleventh electrode pad row 511 and the twelfth electrode pad row 512 by thermocompression with an integrated tool. For this purpose, a maximum width WT2 of a compression tool used during the single tool bonding is set within a range of smaller than the sum (L+L+C2) of the lengths (L and L) of the first electrode pads 51 of the eleventh and twelfth electrode pad rows 511 and 512 and an interval C2 between the first electrode pads 51 and of greater than ½ of the sum (L+L+C2). If the maximum width WT2 is smaller than ½ of the sum, it is impossible to bond the eleventh and twelfth electrode pad rows 511 and 512 with the single tool. See FIG. 7. The width WT2 may be smaller than the width WT1 that is also shown in FIG. 6.

In a case where the dual tool and the single tool are used, the intervals C1 and C2 between the first electrode pads 51 are greater than a flow range of an anisotropic conductive film (ACF) disposed between the first electrode pads 51 and the terminal pads 425 of the scan buffer board assembly 422 so as to prevent a short circuit between the eleventh electrode pad row 511 and the twelfth electrode pad row 512.

While this invention has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. A plasma display device comprising:
    a plasma display panel (PDP);
    a chassis base including a first surface and a second surface and supporting the PDP on the first surface;
    a printed circuit board assembly (PBA) mounted on the second surface; and
    a flexible printed circuit (FPC) electrically connecting electrodes of the PBA and the PDP,
    wherein the FPC comprises:
        a first film;
        a second film;
        a plurality of signal lines formed between the first and second films;
        first electrode pads formed on the first film and bonded to the PBA; and
        second electrode pads formed on the second film and electrically connected to the first electrode pads by the signal lines and bonded to the electrodes of the PDP,
        wherein the first electrode pads are disposed in two rows, and the second electrode pads are disposed in one row, and
        wherein the first electrode pads comprise:
            an eleventh electrode pad row disposed near an end of the first film; and
            a twelfth electrode pad row disposed on the first film inside the eleventh electrode pad row.

2. The plasma display device of claim 1, wherein a first pitch of the first electrode pads is greater than a second pitch of the second electrode pads.

3. The plasma display device of claim 1, wherein a first width of the first electrode pads is greater than a second width of the second electrode pads.

4. The plasma display device of claim 1, wherein the first electrode pads of the eleventh electrode pad row and the first electrode pads of the twelfth electrode pad row are disposed such that axial centers of the electrodes of the eleventh and twelfth rows alternate.

5. The plasma display device of claim 1, wherein each of the first electrode pads of the eleventh and twelfth electrode pad rows is respectively connected to a corresponding signal line of the plurality of signal lines through a via hole formed in the first film.

6. The plasma display device of claim 1, wherein a maximum width of a compression tool used when the first electrode pads are bonded is equal to the sum of a length of the first electrode pad from the eleventh electrode pad row, a length of the first electrode pad from the twelfth electrode pad row, and an interval between the first electrode pads.

7. The plasma display device of claim 6, wherein the interval between the first electrode pads is greater than a flow range of an anisotropic conductive film (ACF).

8. The plasma display device of claim 1, wherein a maximum width of a compression tool used when the first electrode pads are bonded is less than the sum of a length of the first electrode pad from the eleventh electrode pad row, a length of the first electrode pad from the twelfth electrode pad row, and an interval between the first electrode pads, and is greater than ½ of the sum.

9. The plasma display device of claim 1, wherein the electrodes of the PDP include a scan electrode, and the PBA includes a scan board assembly connected to the scan electrode.

10. The plasma display device of claim 9, wherein the scan board assembly further comprises a scan buffer board assembly, and the FPC connects the scan buffer board assembly and the scan electrodes of the PDP.

11. A plasma display device comprising:
    a plasma display panel (PDP);
    a chassis base including a first surface and a second surface and supporting the PDP on the first surface;
    a printed circuit board assembly (PBA) mounted on the second surface; and
    a flexible printed circuit (FPC) electrically connecting electrodes of the PBA and the PDP,
    wherein the FPC comprises:
        a plurality of signal lines;
        a plurality of first electrode pads on a first side of the FPC; and
        a plurality of second electrode pads electrically connected to the first electrode pads by the signal lines, wherein the second electrode pads are on a second side of the FPC, wherein the second side is opposite the first side,
        wherein the first electrode pads are disposed in two rows, and the second electrode pads are disposed in one row, and
        wherein the first electrode pads comprise:
            an eleventh electrode pad row disposed near an end of the FPC; and
            a twelfth electrode pad row disposed on the FPC inside the eleventh electrode pad row.

12. The plasma display device of claim 11, wherein a first pitch of the first electrode pads is greater than a second pitch of the second electrode pads.

13. The plasma display device of claim 11, wherein a first width of the first electrode pads is greater than a second width of the second electrode pads.

14. The plasma display device of claim 11, wherein the first electrode pads of the eleventh electrode pad row and the first electrode pads of the twelfth electrode pad row are disposed such that axial centers of the electrodes of the eleventh and twelfth rows alternate.

15. The plasma display device of claim 11, wherein each of the first electrode pads of the eleventh and twelfth electrode pad rows is respectively connected to a corresponding signal line of the plurality of signal lines through a via hole formed in the FPC.

16. The plasma display device of claim 11, wherein the electrodes of the PDP include a scan electrode, and the PBA includes a scan board assembly connected to the scan electrode.

* * * * *